(12) United States Patent
Mori

(10) Patent No.: US 6,855,589 B2
(45) Date of Patent: Feb. 15, 2005

(54) SEMICONDUCTOR DEVICE WITH ELEVATED SOURCE/DRAIN STRUCTURE AND ITS MANUFACTURE METHOD

(75) Inventor: Toshifumi Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/648,488

(22) Filed: Aug. 27, 2003

(65) Prior Publication Data

US 2004/0041216 A1 Mar. 4, 2004

(30) Foreign Application Priority Data

Aug. 29, 2002 (JP) ........................................ 2002-251268

(51) Int. Cl.[7] ........................................... H01L 21/8238
(52) U.S. Cl. ...................... 438/199; 438/230; 438/300
(58) Field of Search ................................. 438/199, 217, 438/218, 229, 231, 275, 283, 289, 291, 300, 301, 302, 303

(56) References Cited

U.S. PATENT DOCUMENTS 6,121,100 A * 9/2000 Andideh et al. ............ 438/305

FOREIGN PATENT DOCUMENTS

JP  3209731  7/2001

* cited by examiner

*Primary Examiner*—Hoai Pham
(74) *Attorney, Agent, or Firm*—Westerman, Hattori, Daniels & Adrian, LLP

(57) ABSTRACT

A gate electrode is formed over a partial surface area of a semiconductor substrate, with a gate insulating film being interposed therebetween. A first semiconductor film is formed over the semiconductor substrate on both sides of the gate electrode, the first semiconductor film being spaced apart from the gate electrode. An impurity diffusion region is formed in each of the first semiconductor films. An extension region is formed in the surface layer of the semiconductor substrate on both sides of the gate electrode. The extension region is doped with impurities of the same conductivity type as the impurity diffusion region and being connected to a corresponding one of the impurity diffusion regions. Sidewall spacers are formed on the sidewalls of the gate electrode, the sidewall spacers extending beyond edges of the first semiconductor films on the gate electrode side and covering partial surfaces of the first semiconductor films.

7 Claims, 3 Drawing Sheets

SEMICONDUCTOR DEVICE WITH ELEVATED SOURCE/DRAIN STRUCTURE AND ITS MANUFACTURE METHOD

CROSS REFERENCE TO RELATED APPLICATION

This application is based on and claims priority of Japanese Patent Application No. 2002-251268 filed on Aug. 29, 2002, the entire contents of which are incorporated herein by reference.

BACKGROUND OF THE INVENTION

A) Field of the Invention

The present invention relates to a semiconductor device and its manufacture method, and more particularly to a MOS semiconductor device having an elevated source/drain structure and its manufacture method.

B) Description of the Related Art

High speed operation and high integration of semiconductor devices require a shortened gate length and a reduced parasitic capacitance. In order to suppress the short channel effects, it is necessary to shallow source and drain regions. In order to suppress an increase in a sheet resistance to be caused by shallow source and drain regions, techniques of forming a refractory metal silicide layer on the source and drain regions are adopted.

If the refractory metal silicide layer is formed on the shallow source and drain regions, junction leak current increases. A MOS semiconductor device has been proposed having an elevated source/drain structure which does not induce an increase in junction leak current even if a refractory metal silicide layer is formed.

A method of forming an elevated structure is known. According to this method, after impurities are implanted into source and drain regions, a semiconductor film is epitaxially grown selectively on the source and drain regions. With this method, the epitaxial growth temperature is preferably set to 600° C. or lower in order to suppress the lateral diffusion of impurities doped in the source and drain regions. Since the growth temperature cannot be made high, the growth speed of the semiconductor film is slow. This method is not suitable for mass production.

Also, heat treatment in a hydrogen atmosphere is performed before the epitaxial growth in order to remove a native oxide film formed on the surfaces of the source and drain regions. The heat treatment temperature is preferably set in a range from 700 to 900° C. in order to enhance the effects of removing the native oxide film. However, it is not preferable to set the heat treatment temperature to 600° C. or higher in order to suppress the lateral diffusion of impurities in the source and drain regions. If the heat treatment temperature is set to 600° C. or lower, the sufficient effects of removing the native oxide film cannot be expected.

If the source and drain impurity diffusion regions are formed after the elevated source/drain structure is formed, it is possible to prevent the lateral diffusion of impurities in the source and drain regions. However, if the extension regions of the lightly doped drain (LDD) structure are already formed before the elevated source/drain structure is formed, impurities in the extension regions diffuse in the lateral direction. The sufficient short channel suppression effects cannot therefore be expected.

In FIG. 12 of the publication of JP-A-2000-150886 and its related description, a manufacture method for a MOS transistor having an elevated source/drain structure is disclosed which can solve the above-described problems. According to this method, first, by using as a mask the side wall spacers covering the side walls of a gate electrode and an insulating film on the top surface of the gate electrode, an epitaxial layer is selectively grown on source and drain regions. Thereafter, impurity ions are implanted into the source and drain regions, and a titanium silicide layer is formed on the epitaxially grown layers.

After the sidewall spacers are removed, impurities are implanted to form extension regions of the LDD structure. Heat treatment is performed for 30 minutes at 950° C. to diffuse impurities and make the extension regions be continuous with the source and drain regions.

With the method disclosed in the publication of JP-2000-150886, during the heat treatment for making the extension regions be continuous with the source and drain regions, the impurities in the extension regions diffuse also toward the channel. The short channel effects become great. Further, since the heat treatment for diffusing impurities in the extension regions is preformed after the titanium silicide layer is formed, aggregation of titanium silicide is likely to occur. If there is aggregation of titanium silicide, the sheet resistance of the source and drain regions becomes high. Furthermore, with this method, the titanium silicide layer is not formed on the gate electrode. A low resistance of the gate electrode cannot therefore be expected.

SUMMARY OF THE INVENTION

An object of this invention is to provide a semiconductor device having an elevated source/drain structure capable of mitigating the short channel effects and its manufacture method.

According to one aspect of the present invention, there is provided a semiconductor device comprising: a gate electrode formed on a partial surface area of a semiconductor substrate, with a gate insulating film being interposed therebetween; a first semiconductor film made of semiconductor material and formed on surfaces of the semiconductor substrate on both sides of the gate electrode, the first semiconductor film being spaced apart from the gate electrode by some distance; an impurity diffusion region formed in each of the first semiconductor films; an extension region formed in surface layers of the semiconductor substrate on both sides of the gate electrode, the extension region being doped with impurities of a same conductivity type as the impurity diffusion region and being connected to a corresponding one of the impurity diffusion regions; and side wall spacers made of insulating material and formed on side walls of the gate electrode, the side wall spacers extending beyond borders of the first semiconductor films on the gate electrode side and covering partial surfaces of the first semiconductor films.

Impurities are implanted to form impurity diffusion regions of the source and drain, by using as a mask the sidewall spacers covering partial surfaces of the first semiconductor films. It is possible to suppress an increase in the short channel effects to be caused by the lateral diffusion of impurities.

According to another aspect of the present invention, there is provided a method of manufacturing a semiconductor device, comprising steps of: (a) forming a gate insulating film and a gate electrode disposed on the gate insulating film, on a partial surface of a semiconductor substrate; (b) forming first side wall spacers on side walls of the gate electrode; (c) growing first semiconductor films made of semiconductor material on surfaces of the semiconductor substrate not covered with the gate electrode and the first side wall spacers; (d) removing the first side wall spacers; (e) implanting impurities of a first conductivity type into a surface layer of the semiconductor substrate and surface layers of the first semiconductor films, by using the gate electrode as a mask; (f) forming second side wall spacers on the side walls of the gate electrode, the second side wall spacers reaching at least sides of the first semiconductor films on the gate electrode side; (g) implanting impurities of the first conductivity type into regions of the first semiconductor films not covered with the second side wall spacers; and (h) executing heat treatment for activating the impurities implanted at the steps (e) and (g).

After the first semiconductor films are grown, impurities are implanted to form the source and drain regions. The implanted impurities do not experience the thermal history during the growth of the first semiconductor films so that the lateral diffusion of impurities can be suppressed.

As above, after the selective epitaxial growth is performed to form an elevated source/drain structure, the extension regions of the source and drain and the source and drain regions are formed. It is therefore possible to suppress the lateral diffusion of impurities in the extension regions and source/drain regions. Since the epitaxial growth can be made at a high temperature, the growth speed can be increased. After the source and drain regions are formed, the metal silicide film is formed. Since the metal silicide film does not experience the activation heat treatment for impurities, aggregation of metal silicide can be prevented.

DESCRIPTION OF THE PREFERRED EMBODIMENTS

Figure 1A:
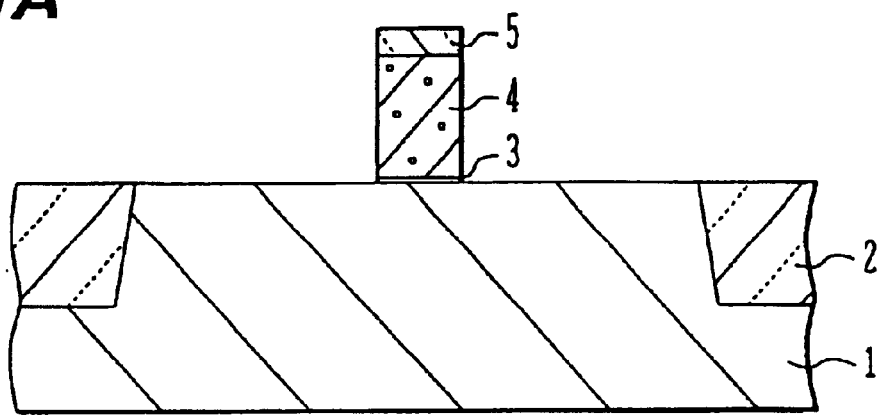
FIGS. 1A to 1E are cross sectional views of a substrate illustrating a semiconductor device manufacture method according to the first embodiment.

With reference to FIGS. 1A to 1E, a semiconductor device manufacture method according to an embodiment of the invention will be described As shown in FIG. 1A, in the surface layer of a semiconductor substrate 1 made of silicon, an element separation insulating film 2 is formed by local oxidation of silicon (LOCOS) or shallow trench isolation (STI). The element separation region 2 defines active regions. The surface of the semiconductor substrate 1 is thermally oxidized to form a silicon oxide film on the surface of each active region, the silicon oxide film having a thickness of about 2 nm and being used as a gate insulating film.

On the semiconductor substrate 1, a polysilicon film having a thickness of 70 to 120 nm is formed by chemical vapor deposition (CVD). Instead of the polysilicon film, an amorphous silicon film may be formed. A silicon nitride film having a thickness of 20 to 40 nm is formed on the polysilicon film by CVD. By covering the region where the gate electrode is to be formed, the three layers from the silicon nitride film to the gate insulating film are dry-etched to leave a mask film 5 made of silicon nitride, a gate electrode 4 of polysilicon and a gate insulating film 3 of silicon oxide.

Figure 1B:
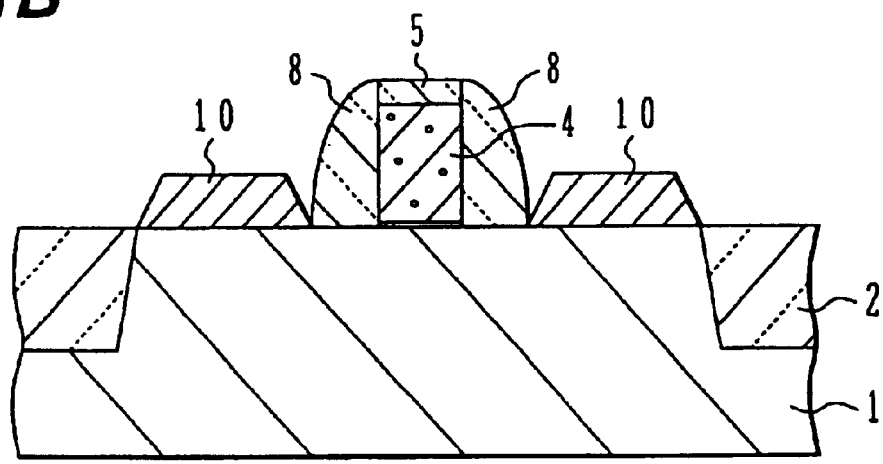

As shown in FIG. 1B, a silicon nitride film having a thickness of 20 to 40 nm is deposited on the substrate whole surface by CVD, and anisotropically dry-etched to leave side wall spacers 8 on the side walls of the gate electrode 4. Before the deposition of the silicon nitride film, a silicon oxide film having a thickness of about 5 nm may be formed by low pressure CVD using tetraethylorthosilicate (TEOS) as source material.

The surface treatment for the semiconductor substrate is performed by using diluted hydrofluoric acid under the condition that a silicon oxide film formed by thermal oxidation is etched by about 5 nm. Heat treatment in a hydrogen gas atmosphere is performed for 120 seconds under the conditions of a pressure of about $1 \times 10^4$ Pa (about 80 Torr), a temperature of 750° C. and a hydrogen gas flow rate of 20 slm. With these processes, a native oxide film formed on the semiconductor substrate is removed.

By using the element separation insulating film 2, side wall spacers 8 and mask film 5 as a mask, silicon is epitaxially grown selectively on the surface of the semiconductor substrate 1 to form an epitaxial layer 10 having a thickness of 20 to 70 nm. For example, the epitaxial layer 10 is grown by CVD under the conditions of a hydrogen gas flow rate of 20 slm, a dichlorsilane ($SiH_2Cl_2$) flow rate of 100 sccm, a hydrogen chloride (HCl) flow rate of 30 sccm, a pressure of $5.3 \times 10^3$ Pa (40 Torr) and a temperature of 800° C. The growth for 300 seconds under these conditions forms an epitaxial layer of about 60 nm.

The epitaxial layer may be formed by ultra high vacuum CVD (UHV-CVD) at a lower growth pressure. As the source gas, silane ($SiH_4$), disilane ($Si_2H_6$) and chlorine ($Cl_2$) may be used.

Figure 1C:
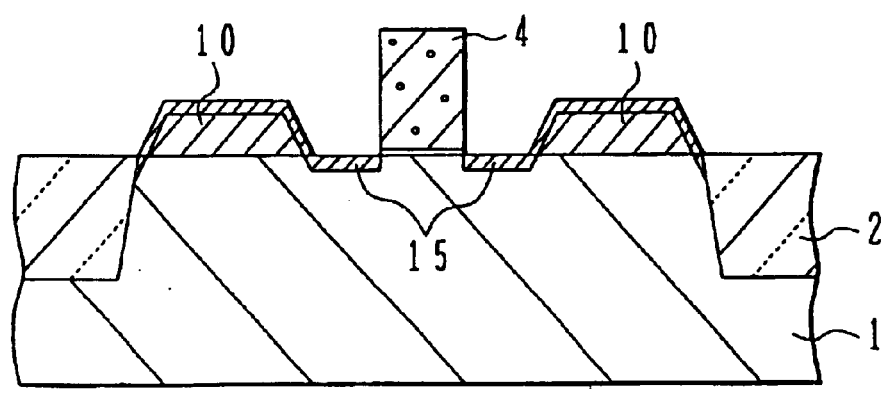

As shown in FIG. 1C, the mask film 5 and side wall spacers 8 shown in FIG. 1B are removed by hot phosphoric acid. The surface of the semiconductor substrate 1 is therefore exposed on both sides of the gate electrode 4. If the silicon oxide film having a thickness of about 5 nm is formed before the silicon nitride film for the sidewall spacers 8 is deposited, this silicon oxide film serves as the surface protection film of the semiconductor substrate 1 during the etching process using hot phosphoric acid. This silicon oxide film is removed by hydrofluoric acid.

If an n-channel MOS transistor is to be formed, arsenic (As) ions are implanted under the conditions of an acceleration energy of 4 keV and a dose of $1.2 \times 10^{15}$ cm$^{-2}$. If a p-channel MOS transistor is to be formed, boron (B) ions are implanted under the conditions of an acceleration energy of 3 keV and a dose of $1 \times 10^{15}$ cm$^{-2}$. With this ion implantation, extension regions 15 of the source and drain regions are formed in the surface layer of the semiconductor substrate on both sides of the gate electrode 4. The impurities are also implanted in the surface layer of the epitaxial layer 10.

Figure 1D:
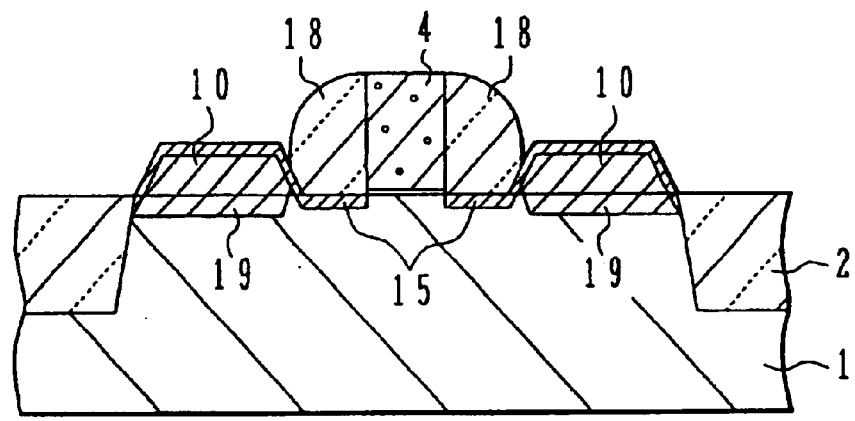

As shown in FIG. 1D, side wall spacers 18 are again formed on the sidewalls of the gate electrode 4. The sidewall spacers 18 cover the surface of the semiconductor substrate on both sides of the gate electrode 4, and extend beyond the borders of the epitaxial layers 10 on the gate electrode side to cover partial surfaces of the epitaxial layers 10. For example, if the thickness of the side wall spacer 8 shown in FIG. 1B is 30 nm, the thickness of the side wall spacer 18 to be formed at the second time is set to 50 nm. The sidewall spacer 18 may be made of silicon oxide or silicon nitride. It may also be made of a two-layer structure of a silicon oxide film and a silicon nitride film.

If an n-channel MOS transistor is to be formed, phosphorous (P) ions are implanted into the epitaxial layer 10 by using the sidewall spacers 18 as a mask under the conditions of an acceleration energy of 6 keV and a dose of $8 \times 10^{15}$ cm$^{-2}$. At this time, phosphorous is also doped in the gate electrode. If a p-channel MOS transistor is to be formed, boron (B) ions are implanted under the conditions of an acceleration energy of 4 keV and a dose of 4×10$^{15}$ cm$^{-2}$. With this ion implantation, source and drain regions 19 are formed in the epitaxial layers 10 and in the surface layers of the semiconductor substrate 1. After the ion implantation, activation heat treatment is performed by rapid thermal annealing (RTA) at 950 to 1050° C. An annealing time is about 0 to 10 seconds.

Figure 1E:
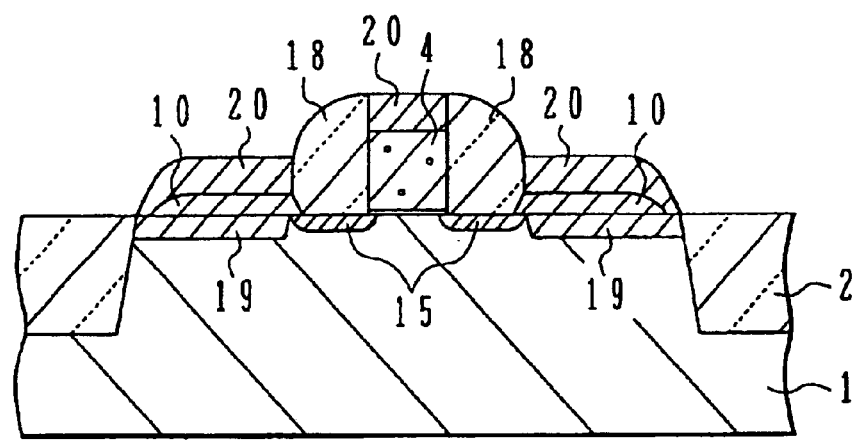

The processes up to the state shown in FIG. 1E will be described. A titanium film is formed on the substrate whole surface and heat treatment is performed. A metal silicide film 20 of titanium silicide is therefore formed on the upper surface of the gate electrode 4 and the surfaces of the epitaxial layers 10. After the heat treatment, an unreacted titanium film is removed. The metal silicide film 20 may be made of cobalt silicide or nickel silicide.

In this embodiment, after the epitaxial layer 10 is formed, ion implantation is performed to form the extension regions 15 and the source and drain regions 19. Since the implanted impurities will not experience the thermal history during the epitaxial growth, it is possible to suppress the lateral diffusion of impurities. The epitaxial growth can be made at a high temperature of 700° C. or higher. It is therefore possible to increase a growth speed. Heat treatment in the hydrogen atmosphere for removing a native oxide film before the epitaxial growth can be performed at a high temperature of 700° C. or higher. A native oxide film can therefore be removed with good reproductivity.

In this embodiment, the metal silicide film 20 is formed after the activation heat treatment for implanted impurities. Since the metal silicide film 20 is not exposed to a high temperature atmosphere of the activation heat treatment, aggregation of metal silicide can be presented.

Also in this embodiment, the sidewall spacers 18 used as a mask for implanting ions and forming the source and drain regions 19 extend beyond the borders of the epitaxial layers 10 on the gate electrode side. Therefore, even if impurities in the source and drain regions diffuse in the lateral direction, they are difficult to reach near at the channel region. Therefore, the impurity concentration of the source and drain regions 19 can be made high without generating punch-through. By making the impurity concentration high, an increase in junction leak current to be caused by the metal silicide film 20 can be presented.

Figure 2:
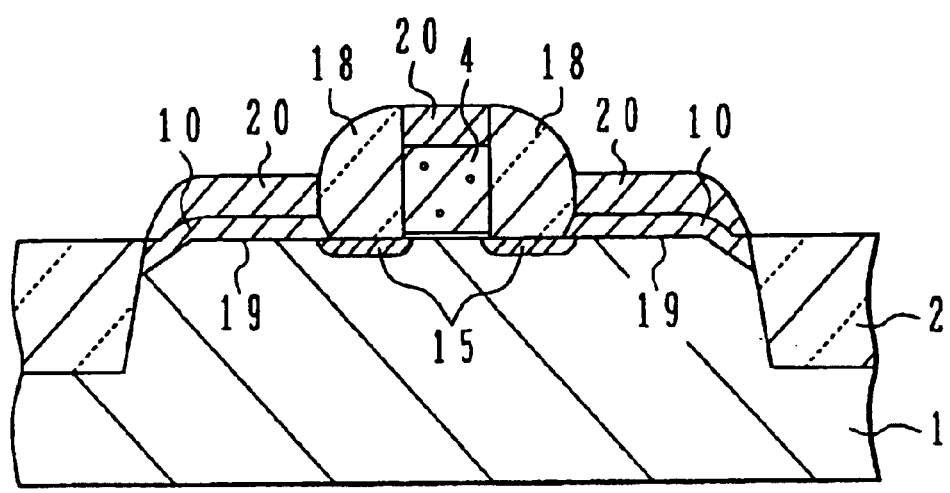
FIG. 2 is a cross sectional view of a semiconductor device according to a modification of the first embodiment.

FIG. 2 is a cross sectional view of a semiconductor device according to a modification of the embodiment. In the embodiment, the source and drain regions 19 extend into the surface layer of the semiconductor substrate 1 as shown in FIG. 1E. In the modification shown in FIG. 2, in partial regions of the epitaxial layers 10 on the gate electrode side, the source and drain regions 19 remain in the epitaxial layers and do not extend into the surface layer of the semiconductor substrate 1. The other structures are similar to those of the semiconductor device of the embodiment shown in FIG. 1E.

In the modification shown in FIG. 2, even if impurities in the source and drain regions 19 diffuse in the lateral direction, most of them enter the regions of the epitaxial layers 10 covered with the side wall spacers 18, and do not enter the surface layer of the semiconductor substrate 1. It is possible to enhance the effects of preventing punch-through.

The present invention has been described in connection with the preferred embodiments. The invention is not limited only to the above embodiments. It is apparent that various modifications, improvements, combinations, and the like can be made by those skilled in the art.

I claim:

1. A method of manufacturing a semiconductor device, comprising steps of:

(a) forming a gate insulating film and a gate electrode disposed on the gate insulating film, over a partial surface of a semiconductor substrate;

(b) forming first sidewall spacers on sidewalls of the gate electrode;

(c) growing first semiconductor films made of semiconductor material over surfaces of the semiconductor substrate not covered with the gate electrode and the first sidewall spacers;

(d) removing the first sidewall spacers;

(e) implanting impurities of a first conductivity type into a surface layer of the semiconductor substrate and surface layers of the first semiconductor films, by using the gate electrode as a mask;

(f) forming second sidewall spacers on the sidewalls of the gate electrode, the second sidewall spacers reaching at least edges of the first semiconductor films on the gate electrode side;

(g) implanting impurities of the first conductivity type into regions of the first semiconductor films not covered with the second side wall spacers; and (h) executing heat treatment for activating the impurities implanted at the steps (e) and (g).

2. A method of manufacturing a semiconductor device according to claim 1, further comprising a step of executing a silicidation reaction and forming a metal silicide film on surfaces of the first semiconductor films not covered with the second side wall spacers and on an upper surface of the gate electrode, the step being executed after the step (h).

3. A method of manufacturing a semiconductor device according to claim 2, wherein in the step (f), the second side wall spacers are formed, the second side wall spacers extending edges of the first semiconductor films on the gate electrode side and covering partial surfaces of the first semiconductor films.

4. A method of manufacturing a semiconductor device according to claim 2, wherein in the step (g), the impurities are implanted under a condition that after the heat treatment in the step (h), the impurities remain at least in partial regions of the first semiconductor films on the gate electrode side without being diffused into the semiconductor substrate.

5. A method of manufacturing a semiconductor device according to claim 1, wherein in the step (f), the second side wall spacers are formed, the second side wall spacers extending edges of the first semiconductor films on the gate electrode side and covering partial surfaces of the first semiconductor films.

6. A method of manufacturing a semiconductor device according to claim 5, wherein in the step (g), the impurities are implanted under a condition that after the heat treatment in the step (h), the impurities remain at least in partial regions of the first semiconductor films on the gate electrode side without being diffused into the semiconductor substrate.

7. A method of manufacturing a semiconductor device according to claim 1, wherein in the step (g), the impurities are implanted under a condition that after the heat treatment in the step (h), the impurities remain at least in partial regions of the first semiconductor films on the gate electrode side without being diffused into the semiconductor substrate.

* * * * *